United States Patent
Matsuo et al.

(10) Patent No.: US 10,224,209 B2
(45) Date of Patent: Mar. 5, 2019

(54) ETCHING METHOD, ARTICLE MANUFACTURING METHOD, AND ETCHING APPARATUS

(71) Applicant: Kabushiki Kaisha Toshiba, Minato-ku (JP)

(72) Inventors: Keiichiro Matsuo, Yokohama (JP); Yusaku Asano, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/217,466

(22) Filed: Jul. 22, 2016

(65) Prior Publication Data

US 2017/0062230 A1    Mar. 2, 2017

(30) Foreign Application Priority Data

Sep. 1, 2015 (JP) .................. 2015-171913

(51) Int. Cl.
| | | |
|---|---|---|
| *H01L 21/306* | (2006.01) | |
| *H01L 21/67* | (2006.01) | |
| *H01L 21/78* | (2006.01) | |
| *C23F 1/20* | (2006.01) | |
| *H01L 21/3213* | (2006.01) | |

(52) U.S. Cl.
CPC .......... *H01L 21/30604* (2013.01); *C23F 1/20* (2013.01); *H01L 21/30608* (2013.01); *H01L 21/32133* (2013.01); *H01L 21/67075* (2013.01); *H01L 21/78* (2013.01)

(58) Field of Classification Search
CPC ......... H01L 21/30604; H01L 21/67075; H01L 21/78; G03F 7/00; C23F 1/20
See application file for complete search history.

(56) References Cited

U.S. PATENT DOCUMENTS

| | | |
|---|---|---|
| 6,762,134 B2 | 7/2004 | Bohn et al. |
| 6,790,785 B1 | 9/2004 | Li et al. |
| 8,278,191 B2 | 10/2012 | Hildreth et al. |

(Continued)

FOREIGN PATENT DOCUMENTS

| | | |
|---|---|---|
| JP | 2004-259872 | 9/2004 |
| JP | 2004-259872 A | 9/2004 |

(Continued)

OTHER PUBLICATIONS

Yusaku Asano, et al., "A Novel Wafer Dicing Method Using Metal-Assisted Chemical Etching", Electronic Components & Technology Conference, Proceedings, 2015, pp. 853-858.

(Continued)

*Primary Examiner* — Duy Vu N Deo
*Assistant Examiner* — Mahmoud Dahimene
(74) *Attorney, Agent, or Firm* — Oblon, McClelland, Maier & Neustadt, L.L.P.

(57) ABSTRACT

An etching method according to an embodiment includes supplying an etchant containing hydrofluoric acid, an oxidizer, and a buffer to a semiconductor substrate including a first region covered with a metal layer made of one or more metals other than noble metals, and a second region covered with a catalyst layer made of a noble metal, such that the etchant comes in contact with the catalyst layer and the metal layer, thereby etching the semiconductor substrate at a position of the catalyst layer.

9 Claims, 8 Drawing Sheets

(56) References Cited

U.S. PATENT DOCUMENTS

| | | |
|---|---|---|
| 8,486,843 B2 | 7/2013 | Li et al. |
| 2005/0230045 A1 | 10/2005 | Okuchi et al. |
| 2006/0159849 A1* | 7/2006 | Morita .................. B82Y 10/00 427/258 |
| 2012/0088372 A1* | 4/2012 | Chien ................. H01L 21/0203 438/753 |
| 2014/0256078 A1 | 9/2014 | Jin et al. |
| 2014/0335411 A1* | 11/2014 | Liu ..................... C23C 18/1601 429/218.1 |

FOREIGN PATENT DOCUMENTS

| | | |
|---|---|---|
| JP | 2005-310948 A | 11/2005 |
| JP | 2011-60846 A | 3/2011 |
| JP | 2011-101009 | 5/2011 |
| JP | 2011-101009 A | 5/2011 |
| JP | 2012-64972 A | 3/2012 |
| JP | 2012-178424 A | 9/2012 |
| JP | 2013-84835 A | 5/2013 |
| JP | 2013-527103 | 6/2013 |
| JP | 2013-527103 A | 6/2013 |
| JP | 2013-257896 A | 12/2013 |
| JP | 2015-509283 A | 3/2015 |
| JP | 2015-119170 | 6/2015 |
| WO | WO 2013/024746 A1 | 2/2013 |

OTHER PUBLICATIONS

Naima Brahiti, et al., "Metal-assisted electroless etching of silicon in aqueous $NH_4HF_2$ solution", Applied Surface Science, vol. 258, Issue 15, 2012, pp. 5628-5637.

Japanese Office Action dated Oct. 4, 2016 in Patent Application No. 2015-171913 with English translation.

* cited by examiner

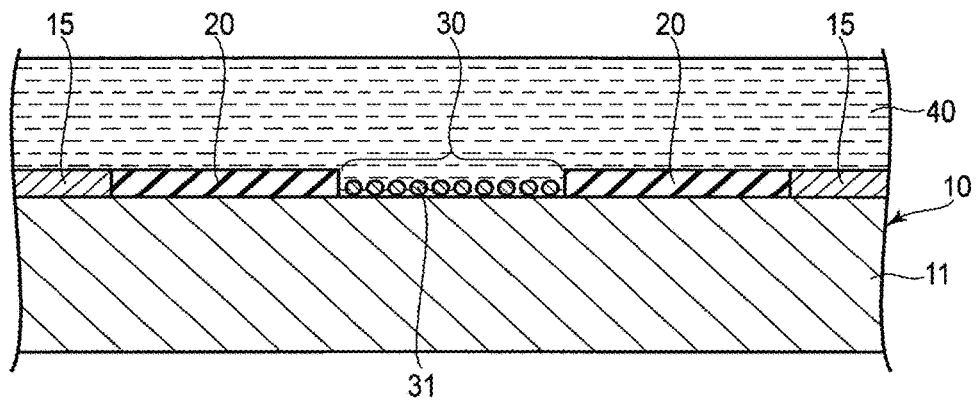
F I G. 4
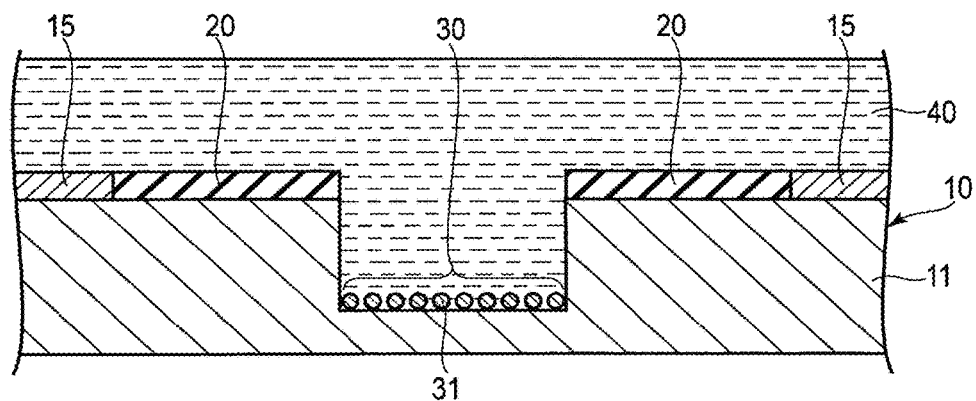
F I G. 5

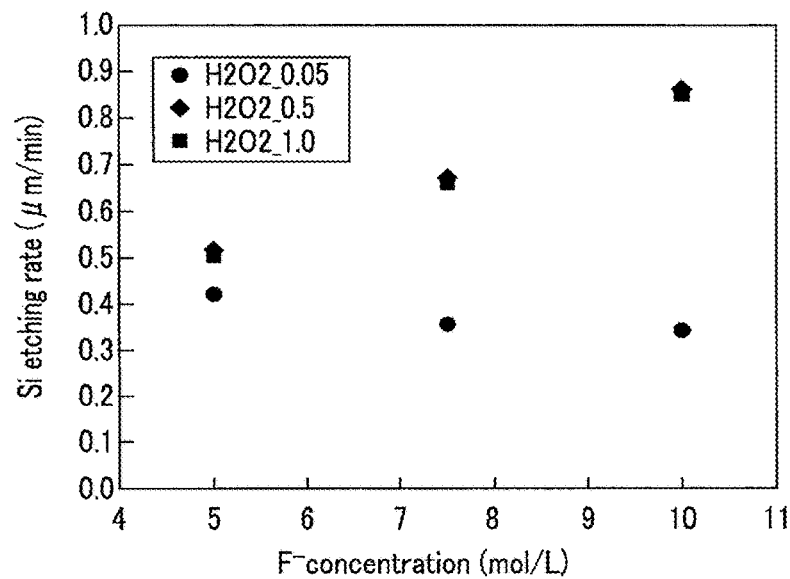
F I G. 11
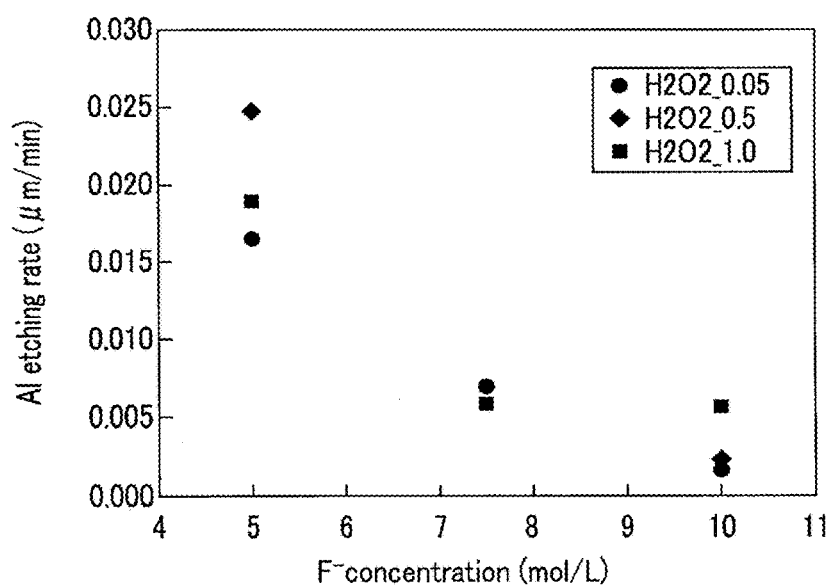
F I G. 12

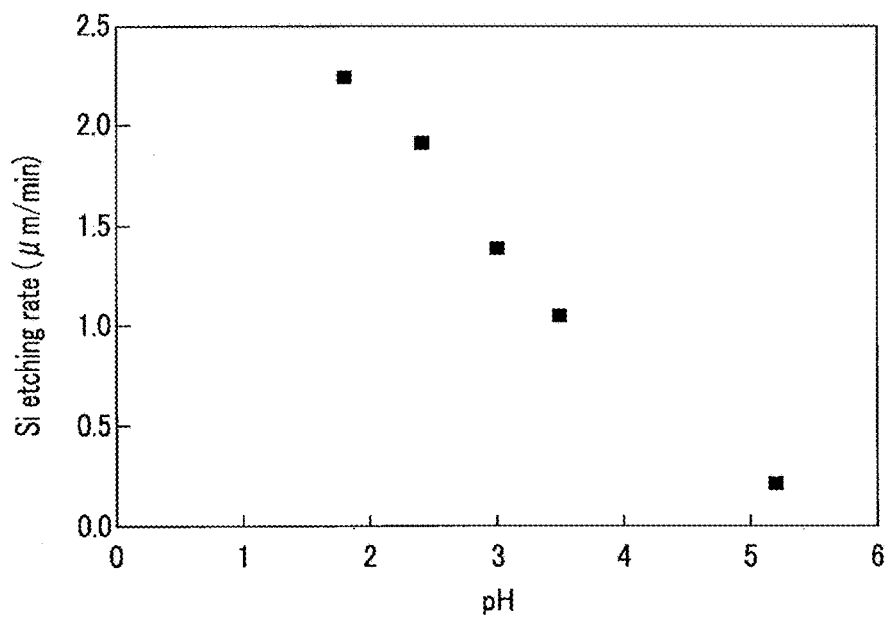
F I G. 13
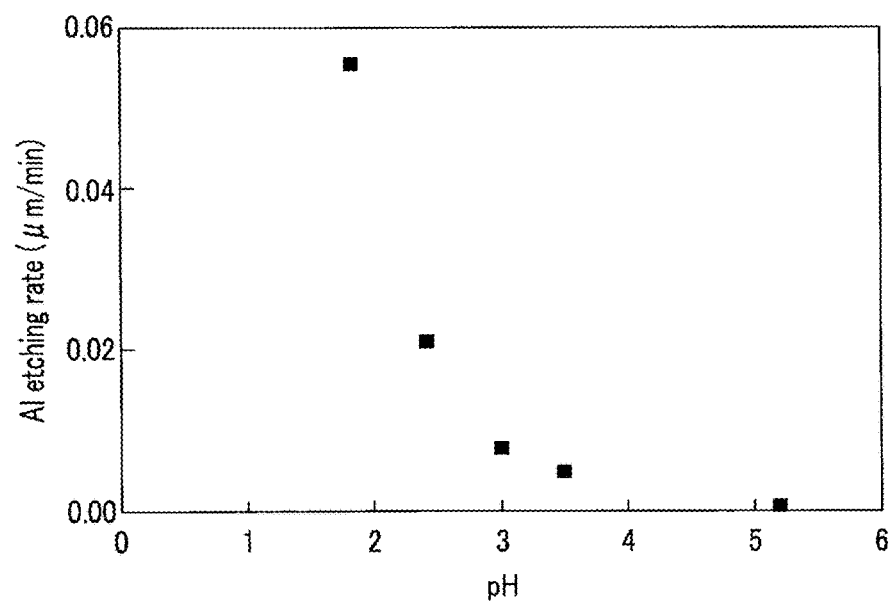
F I G. 14

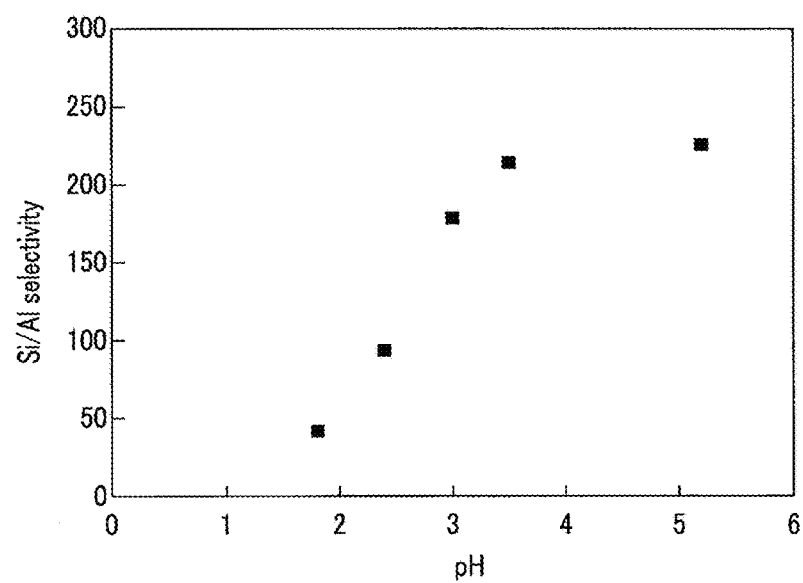
F I G. 15

US 10,224,209 B2

ETCHING METHOD, ARTICLE MANUFACTURING METHOD, AND ETCHING APPARATUS

CROSS-REFERENCE TO RELATED APPLICATIONS

This application is based upon and claims the benefit of priority from Japanese Patent Applications No. 2015-171913, filed Sep. 1, 2015, the entire contents of which are incorporated herein by reference.

FIELD

Embodiments described herein relate generally to an etching method, article manufacturing method, and etching apparatus.

BACKGROUND

Blade dicing which mechanically cuts a wafer by using a rotating blade is generally used to singulate a semiconductor substrate into chips. This blade dicing sequentially forms a plurality of dicing grooves in a semiconductor substrate, thereby singulating the semiconductor substrate into chips. Accordingly, blade dicing has the problem that when the chip size is decreased and thus the number of dicing grooves is increased, the dicing time prolongs in proportional to the number of grooves.

Recently, Metal-Assisted Chemical Etching (MacEtch) method is attracting attention. According to the MacEtch method, for example, a discontinuous film made of a noble metal is formed on a semiconductor substrate, and etching is performed by using this noble metal as a catalyst. For example, the MacEtch method can form a deep hole having a high aspect ratio in a semiconductor substrate.

BRIEF DESCRIPTION OF THE DRAWINGS

FIG. 4 is a sectional view schematically showing an etching step to be performed in the article manufacturing method according to the embodiment;

FIG. 5 is a sectional view schematically showing a state after the elapse of a certain time from the state shown in FIG. 4;

FIG. 11 is a graph showing an example of the relationship between the fluorine concentration in an etchant and the etching rate of silicon;

FIG. 12 is a graph showing an example of the relationship between the fluorine concentration in an etchant and the etching rate of aluminum;

FIG. 13 is a graph showing an example of the relationship between the pH of an etchant and the etching rate of silicon;

FIG. 14 is a graph showing an example of the relationship between the pH of an etchant and the etching rate of aluminum; and FIG. 15 is a graph showing an example of the relationship between the pH of an etchant and the etching selectivity of silicon to aluminum.

DETAILED DESCRIPTION

Figure 1:
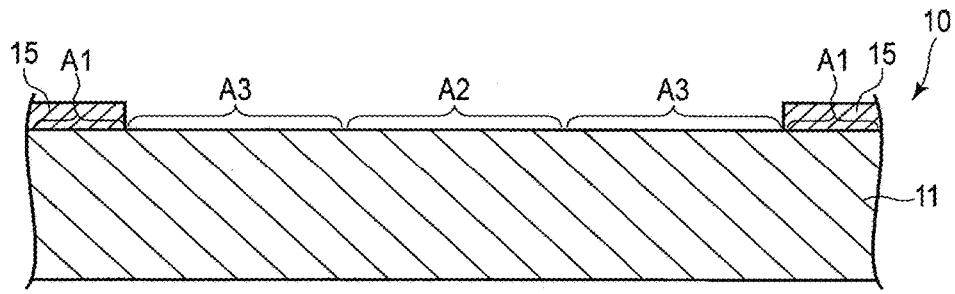
FIG. 1 is a sectional view schematically showing a metal layer formation step to be performed in an article manufacturing method according to an embodiment.
Figure 2:
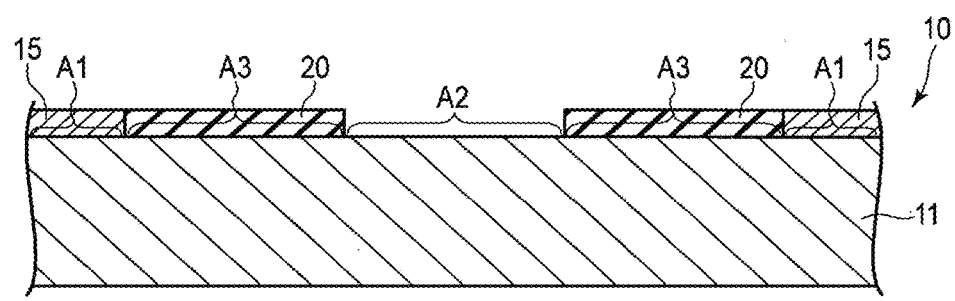
FIG. 2 is a sectional view schematically showing a protective film formation step to be performed in the article manufacturing method according to the embodiment.

An etching method according to a first aspect comprises supplying an etchant containing hydrofluoric acid, an oxidizer, and a buffer to a semiconductor substrate including a first region covered with a metal layer made of one or more metals other than noble metals, and a second region covered with a catalyst layer made of a noble metal, such that the etchant comes in contact with the catalyst layer and the metal layer, thereby etching the semiconductor substrate at a position of the catalyst layer.

An article manufacturing method according to a second aspect comprises forming a metal layer made of one or more metals other than noble metals on a first region of a semiconductor substrate including the first region and a second region, forming a catalyst layer made of a noble metal on the second region, and etching the semiconductor substrate at a position of the catalyst layer by the etching method according to the first aspect.

An etching apparatus according to the third aspect comprises a reaction vessel configured to accommodate a semiconductor substrate, the semiconductor substrate including a first region covered with a metal layer made of one or more metals other than noble metals, and a second region covered with a catalyst layer made of a noble metal, a supply unit configured to supply an etchant containing hydrofluoric acid, an oxidizer, and a buffer to the reaction vessel, a replenish unit configured to replenish the reaction vessel containing the etchant with at least one of the oxidizer and the buffer, and a controller configured to control an operation of the replenish unit such that when at least one of the oxidizer and the buffer is insufficient in the etchant contained in the reaction vessel, the replenish unit replenishes the reaction vessel with the insufficient component.

Embodiments will be explained in detail below with reference to the accompanying drawings. Note that the same reference numerals denote constituent elements which achieve the same or similar functions throughout all the drawings, and a repetitive explanation will be omitted.

A semiconductor chip manufacturing method will be explained as an example of an article manufacturing method according to an embodiment. In this example, a semiconductor substrate is singulated into semiconductor chips by using etching.

In this semiconductor chip manufacturing method, a semiconductor substrate 11 shown in FIG. 1 is prepared first. Note that in FIG. 1, reference symbols A1, A2, and A3 respectively denote first, second, and third regions.

The semiconductor substrate 11 is, for example, a semiconductor wafer made of a material selected from silicon (Si), germanium (Ge), semiconductors made of compounds containing group-III and group-V elements such as gallium arsenide (GaAs) or gallium nitride (GaN), and silicon carbide (SiC). As an example, the semiconductor substrate includes silicon. Note that a term "group" herein used is a "group" of a short-period periodic table.

The semiconductor substrate 11 may be doped with an impurity or have semiconductor elements such as transistors or diodes formed on or in it. The principal surface of the semiconductor substrate 11 may be parallel to any crystal plane of the semiconductor.

Then, a metal layer 15 is formed on the region A1 of the semiconductor substrate 11. Consequently, a wafer 10 shown in FIG. 1 is obtained. The metal layer 15 plays a role of, for example, an electrode.

The metal layer 15 is made of, for example, at least one metal selected from the group consisting of aluminum, copper, and nickel. As an example, the metal layer 15 is made of aluminum.

The metal layer 15 can be formed by, for example, the existing semiconductor process. For example, the metal layer 15 can be formed by film formation by sputtering or vapor phase deposition, mask formation by photolithography, and patterning by etching.

Subsequently, a mask layer 20 is formed on the region A3 of the semiconductor substrate 11.

The mask layer 20 and metal layer 15 define first and second portions. The first portion is a portion of the semiconductor substrate 11 that is covered with the metal layer 15 or mask layer 20. The second portion is a portion of the semiconductor substrate 11 that is not covered with the metal layer 15 and mask layer 20, i.e., an exposed portion. In this method to be explained below, the semiconductor substrate 11 is cut at the position of the second portion.

As the material of the mask layer 20, any material can be used as long as the material can suppress adhesion of a catalyst (to be described later). Examples of the material include organic materials such as polyimide, a fluorine resin, a phenolic resin, an acrylic resin, and a novolak resin, and inorganic materials such as silicon oxide and silicon nitride.

The mask layer 20 can be formed by, for example, the existing semiconductor process. For example, the mask layer 20 made of an organic material can be formed by photolithography. As another example, the mask layer 20 made of an inorganic material can be formed by formation of an insulating layer by vapor phase deposition, mask formation by photolithography, and patterning of the insulating layer by etching. Alternatively, the mask layer 20 made of an inorganic material can be formed by oxidation or nitriding of the surface region of the semiconductor substrate 11, mask formation by photolithography, and patterning of the insulating layer by etching.

Figure 3:
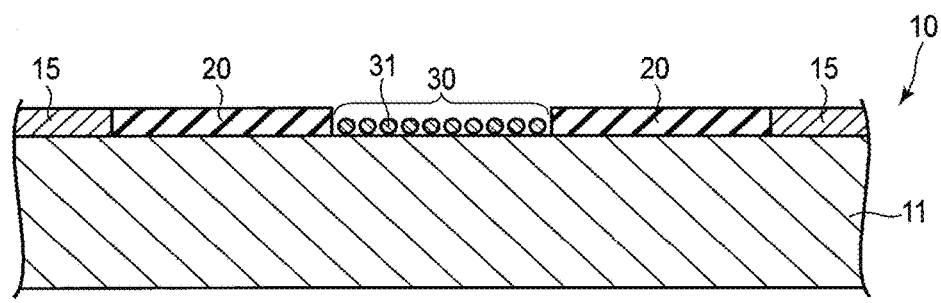
FIG. 3 is a sectional view schematically showing a catalyst layer formation step to be performed in the article manufacturing method according to the embodiment.

Then, a catalyst layer 30 shown in FIG. 3 is formed on the region A2 of the semiconductor substrate 11.

The catalyst layer 30 is made of a noble metal. For example, the catalyst layer 30 is a discontinuous layer, and is an aggregate of a plurality of catalyst particles 31 each made of a noble metal. In the case of using a discontinuous layer as the catalyst layer 30, a length of a flow path through which an etchant 40 (to be described later) flows to reach between the catalyst layer 30 and semiconductor substrate 11 can be shortened and thus the processing uniformity can be improved as compared with the case of using a catalyst layer in a form of a continuous film.

The catalyst layer 30 is used to activate the oxidation reaction of the semiconductor in contact with the catalyst layer 30. The noble metal can be selected from, for example, gold (Au), silver (Ag), platinum (Pt), palladium (Pd), and combinations thereof.

The shape of the catalyst particles 31 is preferably spherical. The catalyst particles 31 may have, for example, a rod-like shape or plate-like shape. The particle size of the catalyst particles 31 is not particularly limited as long as the particle size is much smaller than the width of a second portion 12. The particle size of the catalyst particles 31 is, for example, a few tens of nanometer to a few hundreds of nanometer, and typically, 50 to 200 nm. Also, when the upper surface of the catalyst layer 30 is observed with a scanning electron microscope (SEM) at a magnification of 10,000 to 100,000, the proportion of the total area occupied by the catalyst particles 31 in the area of the field of view, i.e., the coverage is, for example, 50% to 90%, and typically, 75% to 85%.

Note that the "particle size" herein mentioned is a value obtained by the following method. First, an image of the principal surface of the catalyst layer 30 is captured by the SEM. The magnification is 10,000 to 100,000. Then, wholly seen particles 31 are selected from the image, and the area is obtained for each selected particle 31. Subsequently, the diameter of each particle 31 is obtained from its area by assuming that the particle 31 is spherical. This diameter is the particle size of the particle 31.

The catalyst layer 30 can be formed by, for example, electroplating, reduction plating, or displacement plating. The catalyst layer 30 can also be formed by coating of a dispersion containing noble metal particles, or vapor phase deposition such as evaporation or sputtering. Of these methods, displacement plating is particular favorable because it is possible to directly and evenly deposit a noble metal on the region A2.

For the deposition of a noble metal by displacement plating, it is possible to use, for example, an aqueous potassium tetrachloroaurate(III) solution or silver nitrate solution. An example of this process will be explained below.

A solution mixture of an aqueous potassium tetrachloroaurate(III) solution and hydrofluoric acid is an example of a displacement plating solution. A solution of an aqueous potassium tetrachloroaurate(III) solution, hydrofluoric acid, and ammonium fluoride or ammonia is another example of a displacement plating solution. Hydrofluoric acid has a function of removing a native oxide film on the surface of the semiconductor substrate 11.

When the wafer 10 is dipped in the displacement plating solution, a native oxide film on the surface of the semiconductor substrate 11 is removed, and a noble metal, i.e., gold in this example, is deposited in a region of the surface of the semiconductor substrate 11 that is not covered with the mask layer 20. Consequently, the catalyst layer 30 is obtained.

The concentration of potassium tetrachloroaurate(III) in the displacement plating solution is preferably 0.0001 to 0.01 mol/L. Also, the hydrofluoric acid concentration in the displacement plating solution is preferably 0.1 to 6.5 mol/L.

Then, etching is performed by the MacEtch method. More specifically, as shown in FIG. 4, the semiconductor substrate 11 on which the metal layer 15, mask layer 20, and catalyst layer 30 are formed is dipped in the etchant 40. The etchant 40 is an etching liquid containing hydrofluoric acid and an oxidizer. The etchant 40 will be explained in detail later.

Figure 6:
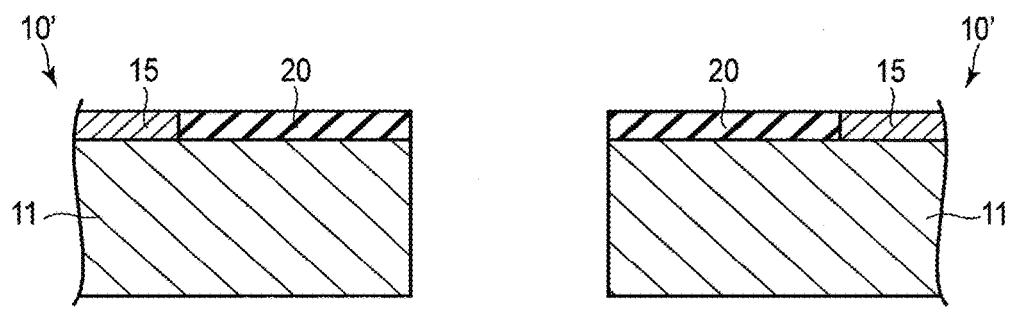
FIG. 6 is a sectional view schematically showing an example of a structure obtained by the article manufacturing method according to the embodiment.

When the etchant 40 as described above is used, the semiconductor is oxidized in only the region A2 of the semiconductor substrate 11 that is in contact with the catalyst particles 31, and the oxide thus produced is dissolved away by hydrofluoric acid. Accordingly, only the portion close to the catalyst particles 31 is selectively etched. The catalyst particles 31 do not chemically change and move down as etching progresses, and the same etching as described above is performed there. Consequently, as shown in FIG. 5, etching progresses below the catalyst particles 31 in a direction perpendicular to the upper surface of the semiconductor substrate 11. Semiconductor chips 10' shown in FIG. 6 are obtained by further advancing this etching.

Note that this etching may be stopped when only a part of the second portion is removed. When a part of the second portion is removed, the mechanical strength of the semiconductor substrate 11 decreases in this position. Therefore, when the semiconductor substrate 11 is cut in this position by a mechanical method, it is possible to easily and rapidly cut the semiconductor substrate 11.

Figure 7:
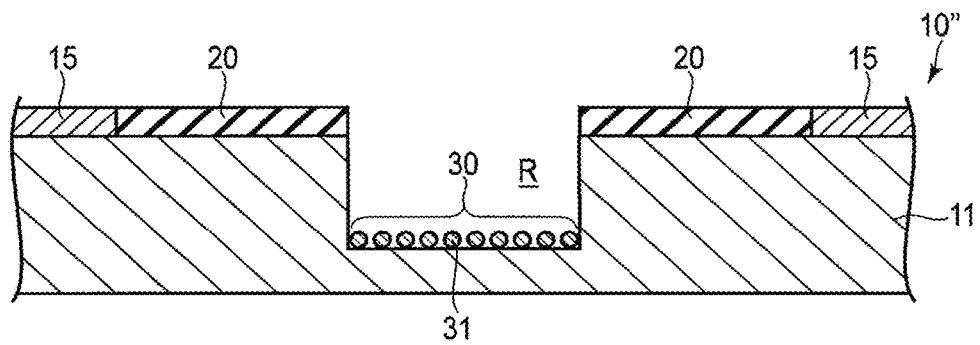
FIG. 7 is a sectional view schematically showing another example of the structure obtained by the article manufacturing method according to the embodiment.

Although the method of singulating a semiconductor substrate into semiconductor chips has been explained, the above-described method may also be used in the manufacture of a semiconductor device 10" having a recess R as shown in FIG. 7.

As described earlier, the etchant 40 contains hydrofluoric acid and an oxidizer.

The concentration of fluorine ions in the etchant 40 is preferably 2.0 to 15 mol/L, more preferably, 5 to 15 mol/L, and more preferably, 7.5 to 15 mol/L. The concentration is further preferably 5 to 10 mol/L, and most preferably, 7.5 to 10 mol/L. If the fluorine ion concentration is increased, the etching selectivity of the semiconductor which is a material of the semiconductor substrate 11 to the metal which is a material of the metal layer 15 increases. Note that although the fluorine ion concentration has no upper limit, it is normally 15 mol/L or less.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is favorable as the oxidizer because no harmful byproduct is produced and a semiconductor element is not contaminated.

The concentration of the oxidizer such as hydrogen peroxide in the etchant 40 is preferably 0.01 mol/L or more, more preferably, 0.05 mol/L or more, and further preferably, 0.5 mol/L or more. If this concentration is low, a high etching rate is difficult to achieve. If this concentration is excessively high, however, excess side etching may occur.

This etchant further contains a buffer. The buffer increases the pH of the etchant, and increases the etching selectivity of the semiconductor which is a material of the semiconductor substrate 11 to the metal which is a material of the metal layer 15.

The buffer contains, for example, at least one of ammonium fluoride and ammonia. As an example, the buffer is ammonium fluoride. As another example, the buffer is a mixture of ammonium fluoride and ammonia.

The concentration of the buffer in the etchant 40 is preferably 5.5 to 26 mol/L, more preferably, 10 to 26 mol/L, and further preferably, 13 to 17.5 mol/L. If the buffer concentration is low, a high etching selectivity is difficult to achieve. If the buffer concentration is high, a high etching rate is difficult to achieve.

When the buffer contains at least one of ammonium fluoride and ammonia, a ratio $M_{NH4+}/M_{F-}$ of an ammonium ion concentration $M_{NH4+}$ in the etchant 40 to a fluorine ion concentration $M_{F-}$ in the etchant 40 is preferably 0.4 to 1.0, more preferably, 0.6 to 0.99, and further preferably, 0.7 to 0.9. If this ratio is low, a high etching selectivity is difficult to achieve. If this ratio is high, a high etching rate is difficult to achieve.

The pH of the etchant 40 is preferably 2.5 to 5, and more preferably, 3 to 5. If the pH is low, a high etching selectivity is difficult to achieve. If the pH is high, a high etching rate is difficult to achieve.

The etchant 40 can further contain another component in addition to the above-described components.

Note that the etchant 40 preferably has a sufficiently low alkali metal concentration. The alkali metal ion concentration is preferably less than 2 mol/L. An alkali metal in the etchant 40 may hinder etching by the MacEtch method.

As explained above, the above-described method can etch a semiconductor at a high selectivity when etching a semiconductor substrate including a metal layer by the MacEtch method.

Next, an etching apparatus usable in etching by the MacEtch method described above will be explained.

Figure 8:
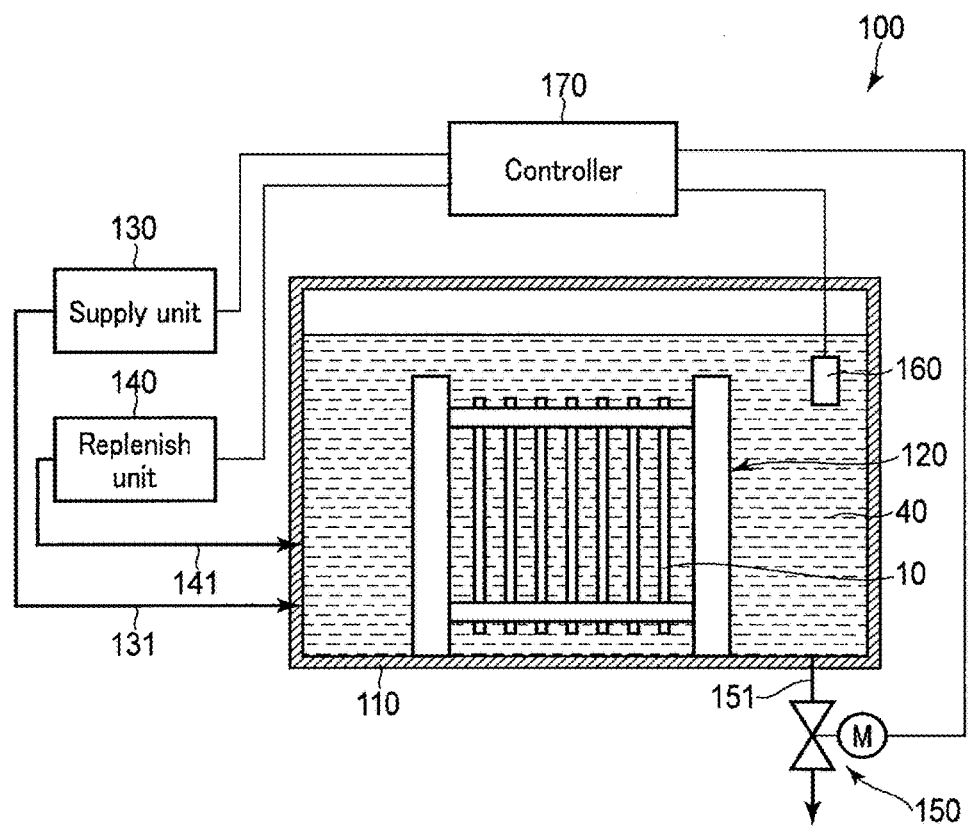
FIG. 8 is a view schematically showing an etching apparatus according to an embodiment.

FIG. 8 is a view schematically showing the etching apparatus according to an embodiment.

An etching apparatus 100 includes a reaction vessel 110, a cassette (or holder) 120, a conveyor unit (not shown), a supply unit 130, a conduit 131, a replenish unit 140, a conduit 141, a valve 150, a conduit 151, a sensor 160, and a controller 170.

The reaction vessel 110 has first and second supply ports for respectively supplying the etchant 40 and a replenisher into the reaction vessel 110, and a discharge port for discharging the etchant 40 outside the reaction vessel 110. The reaction vessel 110 also has a door or lid for loading and unloading the cassette 120.

The cassette 120 holds the wafer 10 shown in FIG. 3 such that a surface of the wafer 10 on the side of the catalyst layer 30 exposes. The cassette 120 may hold only one wafer 10 or a plurality of wafers 10. Note that a release sheet may be adhered on a surface of the wafer 10 that which is opposite to the surface on the side of the catalyst layer 30 in order to protect the former surface.

The conveyor unit opens and closes the door or lid of the reaction vessel 110, loads the cassette 120 into the reaction vessel 110 from a cassette station (not shown), and unloads the cassette 120 from the reaction vessel 110 to the cassette station.

The supply unit 130 is connected to one end of the conduit 131. The other end of the conduit 131 is connected to the first supply port of the reaction vessel 110. The supply unit 130 supplies the etchant 40 to the reaction vessel 110 through the conduit 131.

The replenish unit 140 is connected to one end of the conduit 141. The other end of the conduit 141 is connected to the second supply port of the reaction vessel 110. The replenish unit 140 replenishes the reaction vessel 110 with at least one of the oxidizer and buffer through the conduit 141. Note that in this embodiment, the oxidizer is hydrogen peroxide as an example.

The valve 150 is attached to the conduit 151. In this embodiment, the valve 150 is a motor-operated valve. One end of the conduit 151 is connected to the discharge port of the reaction vessel 110. The other end of the conduit 151 communicates with the outside of the reaction vessel 110. For example, the other end of the conduit 151 is connected to a liquid waste tank (not shown).

The sensor 160 is installed in the reaction vessel 110. The sensor 160 senses a change in composition of the etchant 40 contained in the reaction vessel 110, or a change in properties caused by this composition change. The sensor 160 is, for example, a pH sensor for sensing the pH of the etchant 40.

The controller 170 is electrically connected to the conveyor unit, supply unit 130, replenish unit 140, valve 150, and sensor 160. The controller 170 controls the operations of the conveyor unit, supply unit 130, replenish unit 140, and valve 150 based on at least one of information stored in the controller 170 and a signal supplied by an operator's operation, and an output signal from the sensor 160.

More specifically, when starting etching, the controller 170 controls the operations of the valve 150 and supply unit 130 such that the valve 150 is closed and subsequently the supply unit 130 supplies a predetermined amount of the etchant 40 into the reaction vessel 110.

Then, the controller 170 controls the operation of the conveyor unit such that the conveyor unit opens the door or lid of the reaction vessel 110, loads the cassette 120 holding an unetched wafer 10 from the cassette station into the reaction vessel 110, dips the cassette 120 in the etchant 40, and closes the door or lid of the reaction vessel 110 after that. Subsequently, the controller 170 controls the operation of the conveyor unit such that the conveyor unit opens the door or lid of the reaction vessel 110 after a predetermined time has elapsed, unloads the cassette 120 from the reaction vessel 110 to the cassette station, and closes the door or lid of the reaction vessel 110 after that.

After that, the controller 170 controls the operation of the valve 150 so that the valve 150 opens, thereby discharging the used etchant 40 outside from the reaction vessel 110. Thus, the etching is completed.

Hydrogen peroxide in the etchant 40 is consumed as etching progresses. In one etching process, therefore, the concentration of hydrogen peroxide in the etchant 40 may become lower than an assumed lower limit and thus makes it impossible to achieve a desired etching rate.

Accordingly, for example, the controller 170 controls the operation of the replenish unit 140 such that the replenish unit 140 supplies hydrogen peroxide to the etchant 40 in the reaction vessel 110 when the time having elapsed from the start of etching has reached a predetermined value. The amount of hydrogen peroxide to be supplied to the reaction vessel 110 for the replenishment is, for example, set to be almost equal to or larger than the consumption amount of hydrogen peroxide by pre-checking the relationship between the elapsed time from the start of etching and the consumption amount of hydrogen peroxide.

As etching progresses, not only hydrogen peroxide changes its concentration, but also the buffer changes its concentration. Furthermore, if an excess amount of hydrogen peroxide is supplied in the replenishment operation, the composition of the etchant may fall outside the assumed range.

When the reaction vessel 110 is replenished with hydrogen peroxide, therefore, the controller 170 determines whether to replenish the reaction vessel 110 containing the etchant 40 with the buffer, based on the output from the sensor 160. When the sensor 160 is a pH sensor, for example, if the pH of the etchant 40 is equal to or higher than a first threshold, the controller 170 determines that it is unnecessary to replenish reaction vessel 110 with the buffer. If the pH of the etchant 40 is less than the first threshold, the controller 170 determines that it is necessary to replenish the reaction vessel 110 with the buffer, and controls the operation of the replenish unit 140 such that the replenish unit 140 starts the reaction vessel 110 with the buffer. If the pH of the etchant 40 reaches a second threshold higher than the first threshold, the controller 170 determines that it is unnecessary to further replenish the reaction vessel 110 with the buffer, and controls the operation of the replenish unit 140 so that the replenish unit 140 stops replenishing the reaction vessel 110 with the buffer.

Note that the replenishment with hydrogen peroxide and the replenishment with the buffer may be performed each only once or a plurality of times during one etching.

As is apparent from the above description, the etching apparatus 100 makes it possible to achieve a high etching selectivity and shorten the time required for etching. In addition, the influence of a change in composition of the etchant 40 on the progress of etching can be minimized, and thus a high yield can be achieved.

Test examples will be described below.

(Test 1)

A sample in which a catalyst layer made of gold particles was formed on a silicon substrate was prepared. This sample will be called "sample A" hereinafter. In addition, a sample in which an aluminum layer was formed on a silicon substrate by sputtering was prepared. This sample will be called "sample B" hereinafter.

Then, an etchant was prepared. Specifically, buffered fluoric acid and a hydrogen peroxide solution were mixed together. As buffered fluoric acid, a mixture containing hydrogen fluoride and ammonium fluoride at a molar ratio of 3.6:8.2 was used. The concentration of hydrogen peroxide in the etchant was set at 0.5 mol/L. As the etchant, four types of solutions having different fluorine ion concentrations were prepared.

Subsequently, samples A and B were dipped in each of these etchants, and the etching rates of silicon and aluminum were checked. After that, the etching selectivity of silicon to aluminum was obtained from these etching rates.

Furthermore, an etchant was prepared by mixing hydrofluoric acid and a hydrogen peroxide solution together. The concentration of hydrogen peroxide in the etchant was set at 0.5 mol/L. As the etchant, three types of solutions having different fluorine ion concentrations were prepared.

Then, samples A and B were dipped in each of these etchants, and the etching rates of silicon and aluminum were checked. The etching selectivity of silicon to aluminum was obtained from these etching rates.

Figure 9:
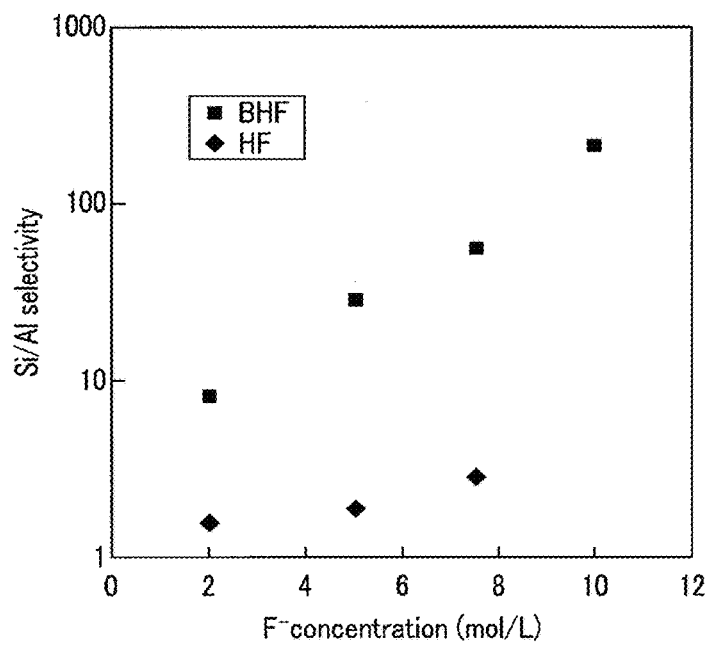
FIG. 9 is a graph showing an example of the relationship between the fluorine concentration in an etchant and the etching selectivity of silicon to aluminum.

FIG. 9 shows the results.

Referring to FIG. 9, the abscissa represents the fluorine ion concentration, and the ordinate represents the etching selectivity. Also, in FIG. 9, "BHF" indicates data obtained when using the etchants prepared by using buffered fluoric acid, and "HF" indicates data obtained when using the etchants prepared by using hydrofluoric acid.

As shown in FIG. 9, when using the etchants prepared by using buffered fluoric acid, it was possible to achieve etching selectivities far higher than those obtained when using the etchants prepared by using hydrofluoric acid. Also, when using the etchants prepared by using buffered fluoric acid, the etching selectivity increased as the fluorine ion concentration was increased.

(Test 2)

The wafer 10 shown in FIG. 3 was prepared. In this test, a silicon substrate was used as the semiconductor substrate 11. The mask layer 20 was formed by using a photoresist. A linear opening having a width of 20 μm was formed in the mask layer 20. The catalyst layer 30 was formed at the position of this opening of the mask layer 20. Gold was used as the material of the catalyst layer 30. Note that the metal layer 15 was omitted.

An etchant was prepared by mixing hydrofluoric acid, an aqueous potassium fluoride solution, and a hydrogen peroxide solution together. This etchant had a hydrogen fluoride concentration of 20 mol/L, a potassium fluoride concentration of 7.5 mol/L, and a hydrogen peroxide concentration of 0.5 mol/L. Note that the pH of this etchant was 2.1.

Then, the abovementioned wafer 10 was dipped in this etchant for a sufficient time, and the state of progress of etching was checked.

Figure 10:
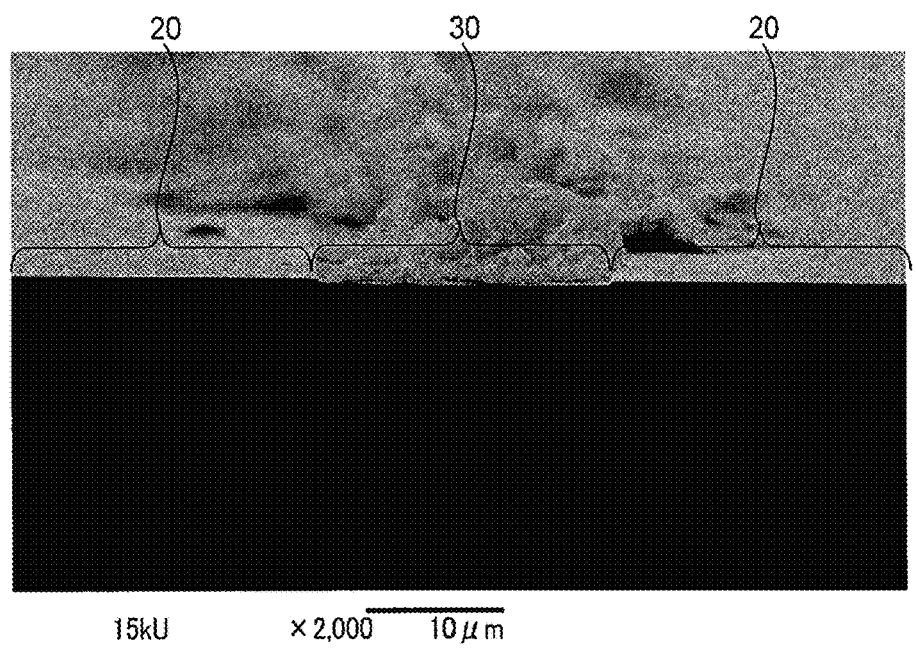
FIG. 10 is a micrograph showing an example of a structure obtained when performing etching by using an etchant containing potassium fluoride instead of a buffer.

FIG. 10 is an electron micrograph showing an example of a structure obtained when performing etching by using an etchant containing potassium fluoride instead of a buffer. As shown in FIG. 10, etching of silicon hardly progressed when using the etchant containing potassium fluoride instead of a buffer.

(Test 3)

An etchant was prepared by mixing buffered fluoric acid and a hydrogen peroxide solution together. As buffered fluoric acid, a mixture containing hydrogen fluoride and ammonium fluoride at a molar ratio of 3.6:8.2 was used. As the etchant, nine types of solutions different in fluorine ion concentration and hydrogen peroxide concentration were prepared.

Subsequently, samples A and B mentioned earlier were dipped in each of these etchants, and the etching rates of silicon and aluminum were checked. FIGS. 11 and 12 show the results.

Referring to FIG. 11, the abscissa represents the fluorine ion concentration in the etchant, and the ordinate represents the etching rate of silicon. Referring to FIG. 12, the abscissa represents the fluorine ion concentration in the etchant, and the ordinate represents the etching rate of aluminum. In FIGS. 11 and 12, "H2O2_0.05", "H2O2_0.5", and "H2O2_1.0" respectively represent that the hydrogen peroxide concentrations in the etchants were 0.05, 0.5, and 1.0 mol/L.

As shown in FIGS. 11 and 12, when the fluorine ion concentration was increased, the etching rate of silicon increased or slightly decreased, whereas the etching rate of aluminum largely decreased. This reveals that the etching selectivity increases when the fluorine ion concentration is increased. Especially when the hydrogen peroxide concentration was 0.5 mol/L or more, the etching rate of silicon increased as the fluorine ion concentration was increased.

(Test 4)

Five types of etchants E1 to E5 were prepared by mixing buffered fluoric acid and a hydrogen peroxide solution together. The following table shows the compositions of these etchants.

Then, samples A and B mentioned earlier were dipped in each of these etchants, and the etching rates of silicon and aluminum were checked. After that, the etching selectivity of silicon to aluminum was obtained from these etching rates. The following table and FIGS. 13, 14, and 15 show the results.

| Etchant | Concentration (mol/L) | | | | | Etching rate (μm/min) | | Si/Al selectivity |
|---|---|---|---|---|---|---|---|---|
| | F⁻ | NH₄F | HF | H₂O₂ | pH | Si | Al | |
| E1 | 10 | 9 | 1 | 0.5 | 5.2 | 0.22 | 0.001 | 224 |
| E2 | 10 | 7 | 3 | 0.5 | 3.5 | 1.07 | 0.005 | 213 |
| E3 | 10 | 6 | 4 | 0.5 | 3 | 1.40 | 0.008 | 177 |
| E4 | 10 | 5 | 5 | 0.5 | 2.4 | 1.92 | 0.021 | 92 |
| E5 | 10 | 4 | 6 | 0.5 | 1.8 | 2.24 | 0.056 | 40 |

Referring to FIG. 13, the abscissa represents the pH of the etchant, and the ordinate represents the etching rate of silicon. Referring to FIG. 14, the abscissa represents the pH of the etchant, and the ordinate represents the etching rate of aluminum. Referring to FIG. 15, the abscissa represents the pH of the etchant, and the ordinate represents the etching selectivity.

As shown in FIGS. 13 and 14, when the pH of the etchant was increased, both the etching rates of silicon and aluminum decreased. A change in etching rate of silicon with respect to the pH of the etchant can be approximated by a straight line, whereas a change in etching rate of aluminum with respect to the pH of the etchant can be approximated by a quadratic curve. Consequently, as shown in FIG. 15, the slope of a change in etching selectivity with respect to the pH was large when the pH was less than 3.5 and small when the pH was 3.5 or more.

Also, as shown in FIG. 15, it was possible to achieve very high etching selectivities when the pH was 2.5 or more, and particularly when the pH was 3 or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An etching method comprising:
    supplying an etchant containing hydrofluoric acid, an oxidizer, and a buffer to a semiconductor substrate including a first region covered with a metal layer made of one or more metals other than noble metals, and a second region covered with a catalyst layer made of a noble metal, such that the etchant comes in contact with the catalyst layer and the metal layer, thereby etching the semiconductor substrate at a position of the catalyst layer, wherein
    the metal layer is made of at least one metal selected from the group consisting of aluminum, copper, and nickel,
    the buffer contains at least one of ammonium fluoride and ammonia, a pH of the etchant is 2.5 to 5, and
    etching the semiconductor substrate at the position of the catalyst layer is performed such that the semiconductor substrate is singulated into semiconductor chips, and the metal layer is an electrode of the semiconductor chips.

2. The method according to claim 1, wherein the oxidizer contains at least one of hydrogen peroxide, nitric acid, AgNO3, KAuCl4, HAuCl4, K2PtCl6, H2PtCl6, Fe(NO3)3, Ni(NO3)2, Mg(NO3)2, Na2S2O8, K2S2O8, KMnO4, and K2Cr2O7.

3. The method according to claim 1, wherein the buffer contains ammonium fluoride.

4. The method according to claim 1, wherein the metal layer is made of aluminum.

5. The method according to claim 1, wherein the semiconductor substrate is made of a material containing silicon.

6. The method according to claim 1, wherein the pH of the etchant is 3 to 5.

7. The method according to claim 1, wherein a concentration of the oxidizer in the etchant is not less than 0.5 mol/L.

8. The method according to claim 1, further comprising:
  forming the metal layer that is the electrode of the semiconductor chips and is made of one or more metals other than noble metals; and
  forming the catalyst layer made of the noble metal on the second region.

9. The method according to claim 1, wherein the catalyst layer is an aggregate of a plurality of catalyst particles each made of a noble metal, and a proportion of a total area occupied by the catalyst particles on an upper surface of the catalyst layer to an area of a field of view in a scanning electron microscope (SEM) at a magnification of 10,000 to 100,000 is 50% to 90%.

* * * * *